United States Patent
Arndt et al.

(10) Patent No.: US 8,710,894 B2
(45) Date of Patent: Apr. 29, 2014

(54) CIRCUIT ARRANGEMENT HAVING A LOAD TRANSISTOR AND A VOLTAGE LIMITING CIRCUIT AND METHOD FOR DRIVING A LOAD TRANSISTOR

(75) Inventors: Christian Arndt, München (DE); Veli Kartal, München (DE); Rainald Sander, München (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/423,121

(22) Filed: Mar. 16, 2012

(65) Prior Publication Data

US 2012/0176164 A1    Jul. 12, 2012

Related U.S. Application Data

(63) Continuation of application No. 10/927,949, filed on Aug. 27, 2004, now abandoned.

(30) Foreign Application Priority Data

Aug. 28, 2003 (DE) .................................. 103 39 689

(51) Int. Cl.
H03K 5/08 (2006.01)

(52) U.S. Cl.
USPC ............ 327/309; 327/314; 327/325; 327/326

(58) Field of Classification Search
USPC .......................... 327/309, 314, 320, 325, 326
See application file for complete search history.

(56) References Cited

U.S. PATENT DOCUMENTS

| 5,379,178 | A   |   | 1/1995 | Graf et al. |
| 6,087,877 | A   |   | 7/2000 | Gonda et al. |
| 6,236,248 | B1  |   | 5/2001 | Koga |
| 6,294,941 | B1  | * | 9/2001 | Yokosawa ..................... 327/309 |
| 6,369,641 | B1  |   | 4/2002 | McNamara et al. |

FOREIGN PATENT DOCUMENTS

DE          4029794 A1     2/1992

OTHER PUBLICATIONS

Optimos Power-Transistor SPP80N06S2-05, Infineon Technologies, <http://www.infineon.com/cmc_upload/documents/012/496/SPP_B_80N06S2-05.pdf>, Apr. 24, 2003, 8 pages.

* cited by examiner

*Primary Examiner* — Kenneth B. Wells
(74) *Attorney, Agent, or Firm* — Maginot, Moore & Beck LLP

(57) ABSTRACT

The present invention relates to a circuit arrangement having the following features: a load transistor having a control connection and a first and second load connection; a drive connection coupled to the control connection of the load transistor and serving for the application of a drive signal; a voltage limiting circuit connected between one of the load connections and the drive connection of the transistor; and a deactivation circuit connected to the voltage limiting circuit and serving for the deactivation of the voltage limiting circuit in a manner dependent on a deactivation signal, which is dependent on a load current through the load transistor and/or on a drive voltage of the load transistor.

17 Claims, 7 Drawing Sheets

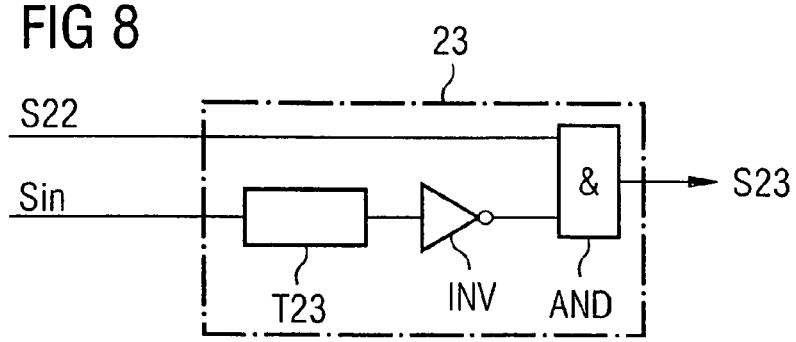
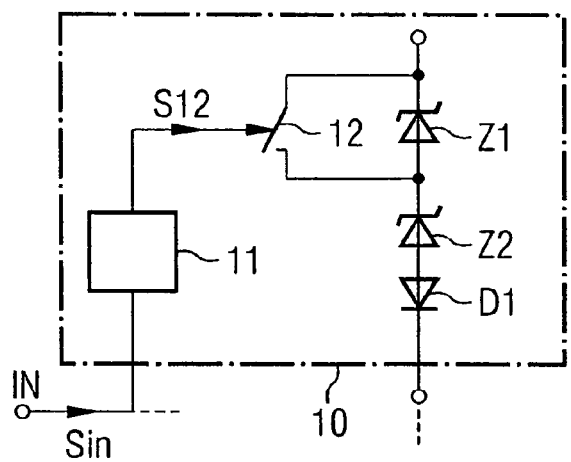
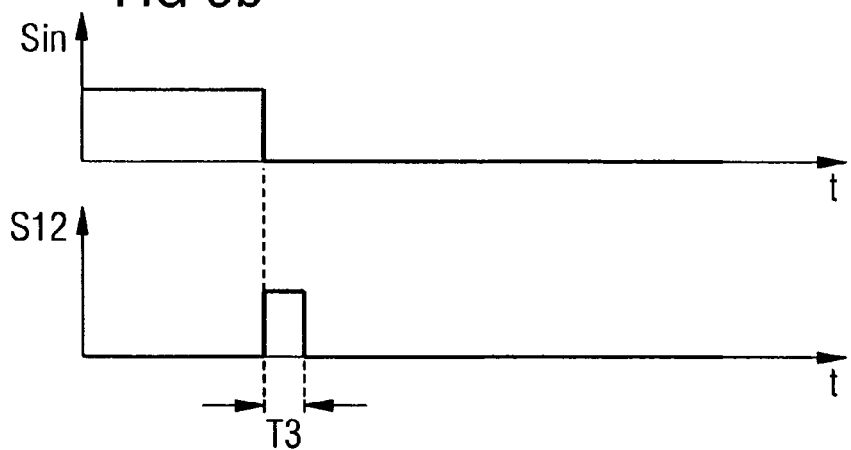

CIRCUIT ARRANGEMENT HAVING A LOAD
TRANSISTOR AND A VOLTAGE LIMITING
CIRCUIT AND METHOD FOR DRIVING A
LOAD TRANSISTOR

This application is a continuation of U.S. Ser. No. 10/927,949, filed Aug. 27, 2004, now abandoned, which claims the benefit of German Application No. 10339689.6-34, filed Aug. 28, 2003.

FIELD OF THE INVENTION

The present invention relates to a circuit arrangement having a load transistor and a voltage limiting circuit and to a method for driving a load transistor.

BACKGROUND

Such a circuit arrangement having a load transistor T and a generally known voltage limiting circuit 10 that functions according to the principle of "active zenering" is illustrated in FIG. 1. In the example, the load transistor T is designed as an n-conducting MOSFET, the drain-source path D-S of which is connected in series with a load t between a supply potential Vbb and reference-ground potential GND. In the simplest case, the voltage limiting circuit 10 comprises a series circuit formed by at least a zener diode Z1 and a diode D1, which are connected oppositely to one another, so that one of the components Z1, D1 is always operated in the reverse direction. This series circuit is connected between the drain connection G of the transistor T, the gate connection G being connected to a drive connection IN for application of a drive signal Sin for the transistor T.

The voltage limiting circuit or protective circuit 10 connected between the drain connection D and the gate connection G of the transistor T protects the transistor in the off state from overvoltages by virtue of the circuit 10 turning the transistor T on as soon as the drain-source voltage thereof reaches a predetermined maximum value. This maximum value to which the drain-source voltage of the transistor T is clamped by the protective circuit 10 is essentially determined by the breakdown voltage of the zener diode Z1.

Circuits corresponding to the limiting circuit 10 which protect the transistor T from overvoltages are used in a targeted manner in connection with the driving of inductive loads through the load transistor T for the purpose of commutating the inductive load Z after the transistor T has turned off. After the presence of a switch-off signal at the drive connection IN, and thus at the gate connection of the transistor T, and in the event of the drain-source voltage rising, the limiting circuit 10 holds the transistor T in the on state until the load has commutated to an extent such that the load path voltage of the transistor T has fallen below the value of the clamping voltage. During this operating state, in which the overall circuit with the limiting circuit 10 and the transistor T functions in the manner of a zener diode, the energy previously stored in the inductive load Z is converted into heat in the transistor. This may lead to thermal instabilities that can overall impair the dielectric strength of the component, as is explained below.

FIG. 2 shows the transfer characteristic curve of a MOSFET that is optimized with regard to a low on resistance, in the example a MOSFET of the SPP80N06S2-05 type from Infineon Technologies AG, Munich. The illustration shows the drain current Id as a function of the gate-source voltage Vgs for two different temperatures T10=37° C. and T20=175° C. The characteristic curve reveals that at a gate-source voltage of less than a limit value Vgs0 or at currents of less than a limit value Id0, an increase in the temperature results in an increase in the current flow; a thermal positive feedback ($\alpha T>0$) is thus present. It is only at gate-source voltages of greater than Vgs0 that an operating state with a thermal negative feedback ($\alpha T<0$) is attained, in the case of which, given the same gate-source voltage, the current decreases as the temperature increases.

Operating the component at small currents in the region of thermal positive feedback may lead to instabilities to the effect that the current that rises in the event of rising temperatures increases the component temperature further, which in turn leads to an increase in the current and may ultimately lead to destruction of the component.

In the case of a cellularly constructed transistor having a multiplicity of identical constructed transistor cells connected in parallel, considerable current and temperature homogeneities may result on account of the effect explained above in the case of operation in the region of thermal positive feedback. In the case of such a component, the cells already heat up to different extents depending on their position in the cell array. Thus, cells in the interior of the cell array usually heat up to a greater extent than cells in the edge region of the cell array, owing to the poorer heat dissipation. In the event of thermal positive feedback, cells that lie in a region of higher temperature accept a greater proportion of the load current that flows, which in turn leads to a further increase in temperature in this region of the cell array and to a further increase in current until destruction of individual cells and thus of the component occurs, while the temperature or current loading of other cells of the cell array may still be far from a destructive loading.

Such problems can be avoided by always choosing the gate-source voltage with a magnitude such that the component is not operated in the operating state of thermal positive feedback, but rather is always operated in conjunction with thermal negative feedback in which a rising temperature brings about a reduction of the current that flows. When using such a transistor in the circuit with a voltage limiting circuit 10 as illustrated in FIG. 1, however, such an operating state cannot always be ensured since the gate-source voltage is set by the clamping circuit 10 in a manner dependent on the voltage conditions in the load path of the transistor T. In the event of a relatively lengthy overvoltage across the transistor, the transistor is operated in the region of thermal positive feedback at least during the switch-on and before the switch-off, which may lead to destruction of the component.

SUMMARY

It is an aim of the present invention to provide a circuit arrangement having a load transistor and a voltage limiting circuit in which current and temperature instabilities of the load transistor are prevented. Moreover, it is an aim of the invention to provide a method for driving a load transistor having a voltage limiting circuit connected between a load connection and a drive connection, in which current and temperature instabilities of the load transistor are prevented.

These aims are achieved by means of a circuit arrangement in accordance with the features of claim 1 and a method in accordance with the features of claim 11. The subclaims relate to advantageous refinements of the invention.

The circuit arrangement comprises a load transistor having a control connection and a first and second load connection, a drive connection coupled to the control connection of the load transistor and serving for the application of a drive signal for the load transistor, and a voltage limiting circuit connected between one of the load connections and the drive connection of the transistor. A deactivation circuit connected to the voltage limiting circuit and serving for the deactivation of the voltage limiting circuit in a manner dependent on a deactivation signal is additionally present, said deactivation signal being dependent on a load current through the load transistor and/or on a drive voltage of the load transistor. The deactivation circuit is preferably designed to deactivate the voltage limiting circuit if the load current falls below a predetermined value and/or if the drive voltage falls below a predetermined value, these limit values being chosen in such a way as to prevent operation of the component in the state of thermal positive feedback.

The deactivation circuit that deactivates the voltage limiting circuit in a manner dependent on the load current or the drive voltage of the transistor prevents the load transistor, driven by the voltage limiting circuit, from being operated at an operating point at which thermal positive feedback occurs which might result in the thermal instabilities mentioned. If, with the voltage limiting circuit switched off, an overvoltage—for example during the commutation of an inductive load—is present across the load transistor, then the load transistor undergoes transition to the avalanche mode as soon as its avalanche voltage is reached. In the avalanche mode, losses are distributed uniformly over the component between the individual cells, so that the avalanche mode, in the case of small load currents, represents a stabler operating state of the component than an operating state in the event of driving by the voltage limiting circuit in such a way that small load currents are established.

Preferably, the load transistor is integrated in a first semiconductor chip, while the voltage limiting circuit and the deactivation circuit are integrated in a second semiconductor chip that is applied to the first semiconductor chip and serves as a logic chip. Further protection or driving functions of the load transistor, such as, for example, an overtemperature protection or a current limiting, may be integrated in said logic chip in a sufficiently known manner, as is known in the case of intelligent semiconductor switches (smart-FET). When the load transistor is integrated in such an arrangement, it must be taken into account that the maximum voltage that occurs, corresponding to the avalanche voltage of the load transistor, is either lower than the so-called technology voltage of the logic chip, or that an additional protective structure, for example a protective resistor, is present for the logic chip in order to prevent damage to the logic chip during avalanche operation of the load transistor. Customary values for the technology voltage of the logic chip in the case of a smart-FET lie in the region of 80 V, while the values for the technology voltage of the load transistor chip lie in the region of 50 V, with the result that, in this case, the logic chip is not jeopardized when the load transistor is operated in the avalanche mode.

In its simplest embodiment, the voltage limiting circuit comprises at least one zener diode and a diode connected oppositely to the zener diode. Such voltage limiting circuits serve in a known manner for protecting the load transistor from overvoltages and for the targeted commutation of inductive loads that are connected in series with the load transistor. The voltage at which the voltage limiting circuit starts to turn the load transistor on, and which is essentially determined by the breakdown voltage of the at least one zener diode, is, of course, such that it lies below the technology voltage of the load transistor chip.

Furthermore, it is possible for at least two zener diodes to be connected in series, at least one of which can optionally be bridged. This enables the threshold voltage of the voltage limiting circuit to be set and, in particular, enables an inductive load to be commutated with a commutation voltage that varies over time.

In an embodiment that is particularly simple to realize, the deactivation circuit comprises a switch connected between one load connection and the drive connection in series with the voltage limiting circuit, the voltage limiting circuit being activated when the switch is closed and being deactivated when the switch is open.

In order to provide the deactivation signal, in one embodiment, the deactivation circuit comprises a current measuring arrangement, which determines a load current through the load transistor and serves for providing a current signal, and a comparator circuit, which compares the current measurement signal with a reference value.

As an alternative to the current measuring arrangement or in addition to the current measuring arrangement, the deactivation circuit comprises a voltage measuring arrangement, which determines the drive voltage of the load transistor and serves for providing a voltage measurement signal, and a comparator circuit, which compares the voltage measurement signal with a reference value and serves for providing the deactivation signal.

Preferably, the deactivation circuit is designed to deactivate the voltage limiting circuit only after a predetermined time duration after the current measurement signal or the voltage measurement signal has fallen below the respective reference value. This is based on the insight that small load currents or small drive voltages that are present only for a short time duration that is less than the predetermined time duration do not suffice, despite thermal positive feedback, to generate thermal instabilities that may lead to destruction of the component.

In a further embodiment, the deactivation circuit is designed to deactivate the voltage limiting circuit at the earliest with or a predetermined time duration after the presence of a switch-off signal for the load transistor and to activate the voltage limiting circuit preferably in each case during the presence of a switch-on signal. This is advantageous because this ensures that when the load transistor is switched off, the deactivation circuit is initially activated in order to protect the transistor from overvoltages and, in particular, to commutate an inductive load. In this case, the voltage limiting circuit is deactivated only when, after a switch-off signal, the load current or the drive voltage fall below a respectively predetermined value.

In the method for driving a load transistor having a drive connection, which is coupled to a drive terminal for the application of a drive signal, and having a first and second load connection, in which a voltage limiting circuit is connected between one of the load connections and the drive connection, provision is made for deactivating the voltage limiting circuit in a manner dependent on a load current through the load transistor and/or in a manner dependent on a drive voltage of the load transistor.

In one embodiment of this method, it is provided that the voltage limiting circuit is deactivated if the load current has fallen below a predetermined value and/or the drive voltage has fallen below a predetermined value.

Preferably, the voltage limiting circuit is deactivated only after a predetermined time after the load current has fallen below a predetermined value and/or the drive voltage has fallen below a predetermined value. This is based on the insight that operating the load transistor in the operating state with thermal positive feedback for only a short time duration does not suffice to bring about destruction of the load transistor on account of thermal instabilities.

In a further embodiment, it is provided that the voltage limiting circuit is deactivated at the earliest with the presence of a switch-off signal or at the earliest a predetermined time duration after the presence of a switch-off signal, while the voltage limiting circuit is preferably activated with a switch-on signal or during the presence of a switch-on signal actually prior to the switch-off signal. This ensures that the voltage limiting circuit is activated in order to protect the load transistor from overvoltages or to commutate an inductive load if the load transistor is switched off in a manner driven by the drive signal. It is only after the presence of the switch-off signal that the voltage limiting circuit can be deactivated if the load current or the drive voltage falls below the respectively predetermined value.

BRIEF DESCRIPTION OF THE DRAWINGS

The present invention is explained in more detail below using exemplary embodiments with reference to figures.

FIG. 8 shows an exemplary realization of a circuit unit that provides the deactivation signal in the circuit arrangement in accordance with FIG. 7a.

FIG. 9 shows an exemplary embodiment of a voltage limiting circuit with an adjustable limiting voltage (FIG. 9a) and temporal profiles of selected signals in the circuit arrangement (FIG. 9b).

In the figures, unless specified otherwise, reference symbols designate identical parts with the same meaning.

DETAILED DESCRIPTION

Figure 3:
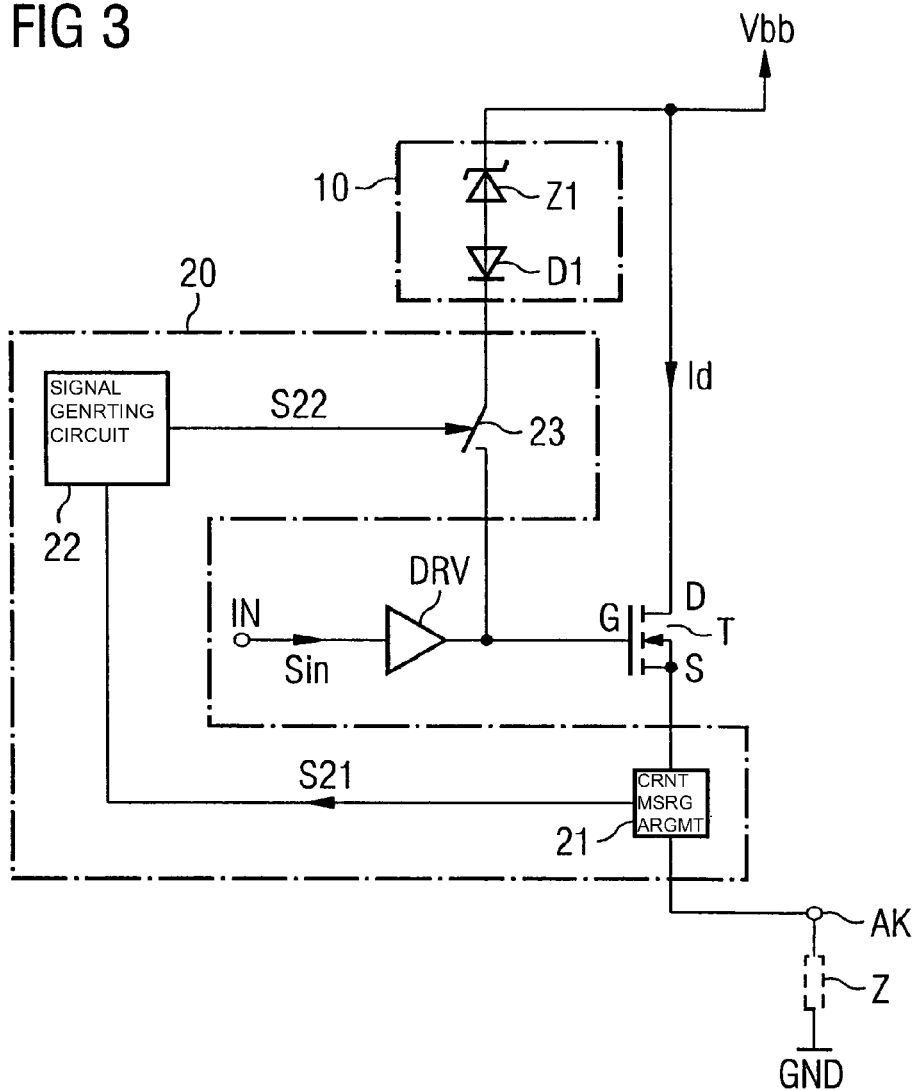
FIG. 3 shows a first exemplary embodiment of a circuit arrangement according to the invention having a load transistor, a voltage limiting circuit and a deactivation circuit for the voltage limiting circuit.

FIG. 3 shows a first exemplary embodiment of a circuit arrangement according to the invention, comprising a load transistor T and a voltage limiting circuit 10 for the load transistor T. In the exemplary embodiment, the load transistor T is designed as an n-channel MOSFET, the drain and source connections D, S of which form its load connections and the gate connection of which forms its drive connection. In the exemplary embodiment, the voltage limiting circuit 10 comprises a series circuit formed by a zener diode Z1 and a diode D1, which are connected oppositely to one another, with the result that one of the two components is always operated in the reverse direction. In this case, the cathode of the zener diode Z1 is coupled to the drain connection D of the MOSFET T. The series circuit comprising the zener diode Z1 and the diode D1 is connected between the drain connection and the gate connection G of the MOSFET T.

The circuit arrangement furthermore comprises a deactivation circuit 20 for deactivating the voltage limiting circuit 10 in a manner dependent on a load current Id through the MOSFET T. For this purpose, the deactivation circuit 20 comprises a switch 23, which is connected between the drain connection D and the gate connection G in series with the voltage limiting circuit 10 and which activates the voltage limiting circuit in the closed state and deactivates it in the open state. The deactivation circuit 20 comprises a current measuring arrangement 21, which detects the load current Id through the MOSFET T and generates a load current signal S21, which is fed to a deactivation signal generating circuit 22, which provides a deactivation signal S22 for driving the switch 23. The current measuring arrangement 21, which is depicted only schematically as a block in the load current path of the MOSFET T, may be realized in an arbitrary conventional manner. Thus, there is the possibility, in particular, of detecting the load current by employing the so-called current sense principle, in which a measuring transistor (not specifically illustrated) having a relatively small transistor area is present in parallel with the load transistor. In this case, by means of the area ratio of measuring transistor to load transistor, the current through the load transistor can be deduced on the basis of the detected current through the measuring transistor.

The deactivation signal generating circuit 22 illustrated in FIG. 3 is designed to open the switch 23 in order to deactivate the voltage limiting circuit 10 if the load current Id has fallen below a predetermined value. This limit value at which the voltage limiting circuit 10 is deactivated is chosen such that at currents of less than this limit value, the transistor T undergoes transition from the operating state of thermal negative feedback to the operating state of thermal positive feedback. Switching off the voltage limiting circuit 10 at such small load currents has the effect that when an overvoltage is present, the transistor T can no longer be turned on via the voltage limiting circuit 10, rather the transistor T, in the case of such overvoltages, undergoes transition to the avalanche mode, which, at small load currents, represents the stabler operating state in comparison with a slight turn-on by the limiting circuit 10.

Figure 4:
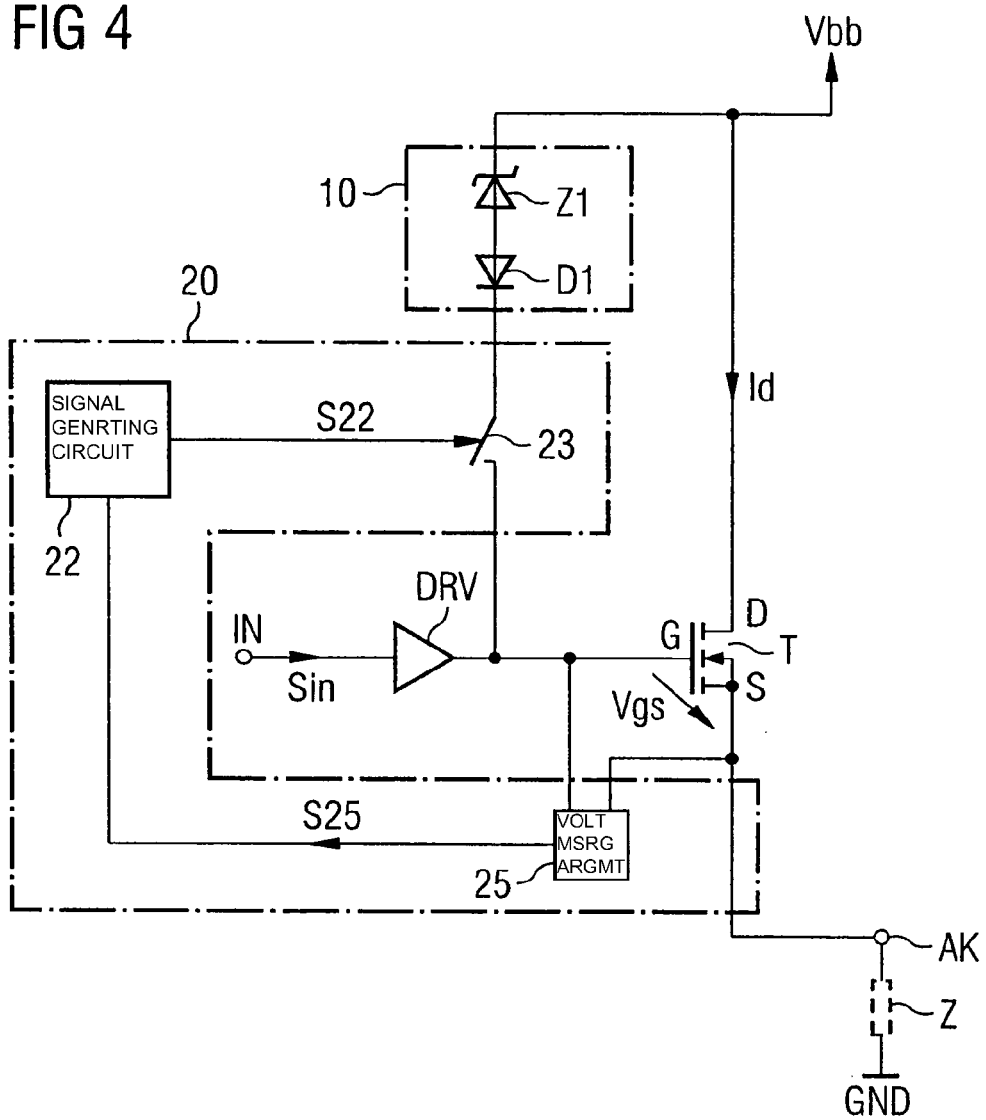
FIG. 4 shows a second exemplary embodiment of a circuit arrangement according to the invention.

FIG. 4 shows a modification of the circuit arrangement illustrated in FIG. 3, which differs from that illustrated in FIG. 3 by virtue of the fact that, instead of the load current Id through the load transistor T, the gate-source voltage Vgs of the load transistor T is evaluated in order to deactivate the voltage limiting circuit 10. The deactivation circuit 20 in this case comprises a voltage measuring arrangement 25, which is connected between the gate connection G and the source connection S of the MOSFET T and provides a voltage measurement signal S25. This voltage measurement signal S25 is fed to a deactivation signal generating circuit 22, which, depending on said voltage measurement signal S25, generates the deactivation signal S22 for the switch 23 connected in series with the voltage limiting circuit.

Figure 2:
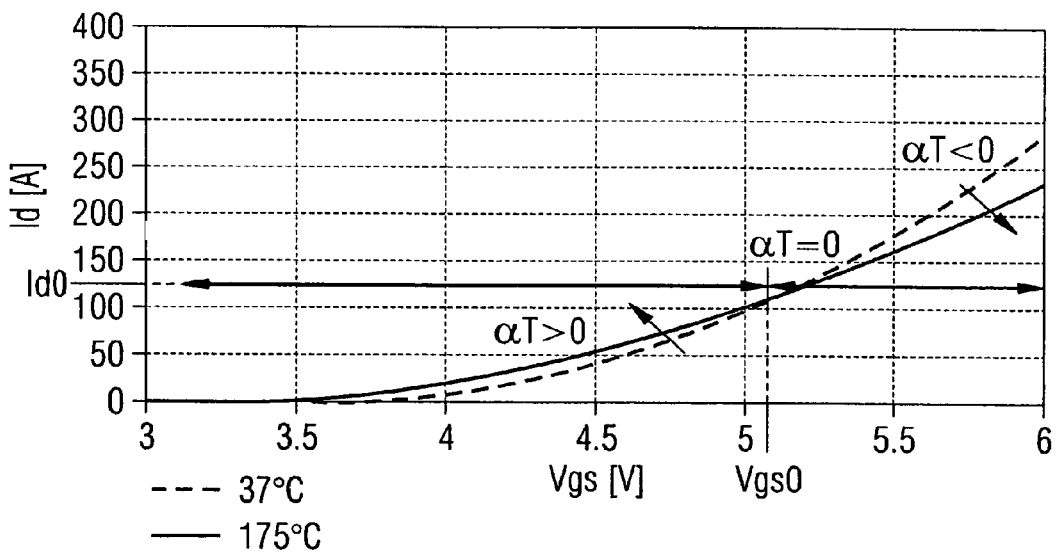
FIG. 2 shows the transfer characteristic curve of a MOSFET, the load current being plotted against the drive voltage.

Referring to FIG. 2, the operating state of the MOSFET in which a thermal positive feedback is present is distinguished by small load currents or small gate-source voltages, so that a presence of this operating state can be determined either by means of the load current Id flowing, by means of the circuit in accordance with FIG. 3, or by means of the gate-source voltage Vgs, as in the case of the circuit in accordance with FIG. 4, in order then to deactivate the transistor in a manner dependent on the values determined.

For the driving of the transistor T, the gate connection G thereof is coupled to an input terminal IN, at which a drive signal Sin for the transistor T is present. A driver circuit DRV serves for converting the signal Sin that usually has a logic level to suitable drive levels for the load transistor T. The levels for driving the transistor T in the on state by means of the drive signal Sin are usually chosen such that the component is not operated in the operating range of thermal positive feedback, so that the load current Id flowing and the gate-source voltage Vgs present, respectively, are greater than the limit values at which the voltage limiting circuit 10 is switched off. With transistor T driven in the on state by the signal Sin, it is thus ensured, given customary dimensioning of the circuit, that the voltage limiting circuit 10 is activated.

Figure 5:
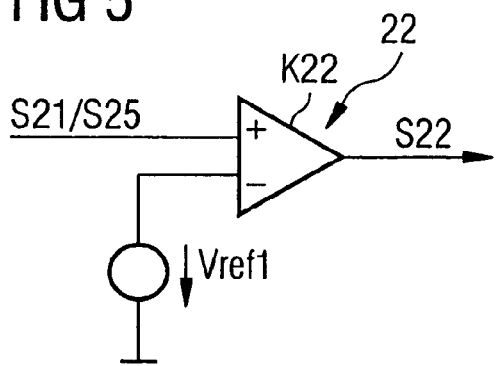
FIG. 5 shows an exemplary embodiment of a circuit arrangement that provides a deactivation signal in the deactivation circuit.

FIG. 5 shows a simple example of the realization of the deactivation signal generating circuit 22, which has a comparator K22 to which, depending on the exemplary embodiment, the current measurement signal S21 of the current measuring arrangement (FIG. 3) or the voltage measurement signal S25 of the voltage measuring arrangement 25 (FIG. 4) is fed. The comparator K22 compares this measurement signal S21 or S25 with a reference value Vref1 provided by a reference voltage source. The measurement signal S21 or S25 is fed to the noninverting input of the comparator K22, and the reference signal Vref1 is fed to the inverting input of the comparator K22. The deactivation signal S22 present at the output of the comparator K22 assumes a high level in order to close the switch 23 (FIGS. 3 and 4) if the measurement signal S21 or S25 is greater than the reference value Vref1, and the deactivation signal S22 assumes a low level in order to open the switch 10 if the measurement signal S21 or S25 falls below the value of the reference signal Vref1. The value of the reference signal Vref1 is dependent on whether the measurement signal is the current measurement signal S21 or the voltage measurement signal S25 and is chosen suitably in order to open the switch 10 when the MOSFET T undergoes transition in the operating range with thermal positive feedback. This operating range can be inferred, in a sufficiently known manner, from the transfer characteristic curve of the MOSFET T respectively used, in order to define the reference value Vref1 in a manner dependent thereon.

Figure 6A:
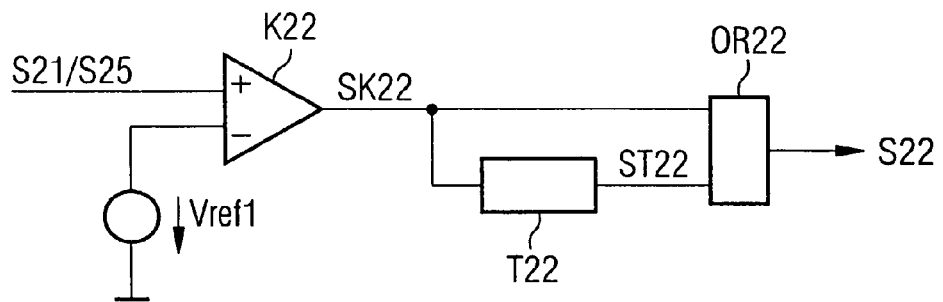
FIG. 6 shows a further exemplary embodiment of the circuit unit that provides the deactivation signal (FIG. 6a) and exemplary temporal profiles of selected signals that occur in said circuit unit (FIG. 6b).

FIG. 6a shows a further exemplary embodiment of deactivation signal generating circuit 22, which differs from that illustrated in FIG. 5 by virtue of the fact that a timing element T22 and an OR element OR22 are present. The output signal 8K22 of the comparator K22 connected up in a manner corresponding to the circuit in FIG. 5 is fed to the timing element T22 and one input of the OR element OR22. The output signal of the timing element T22 is fed to the input of the OR element OR22, the timing element T22 being designed to map a falling edge of the input SK22 onto the output signal ST22 thereof in a manner time-delayed by a time duration T1.

Figure 6B:
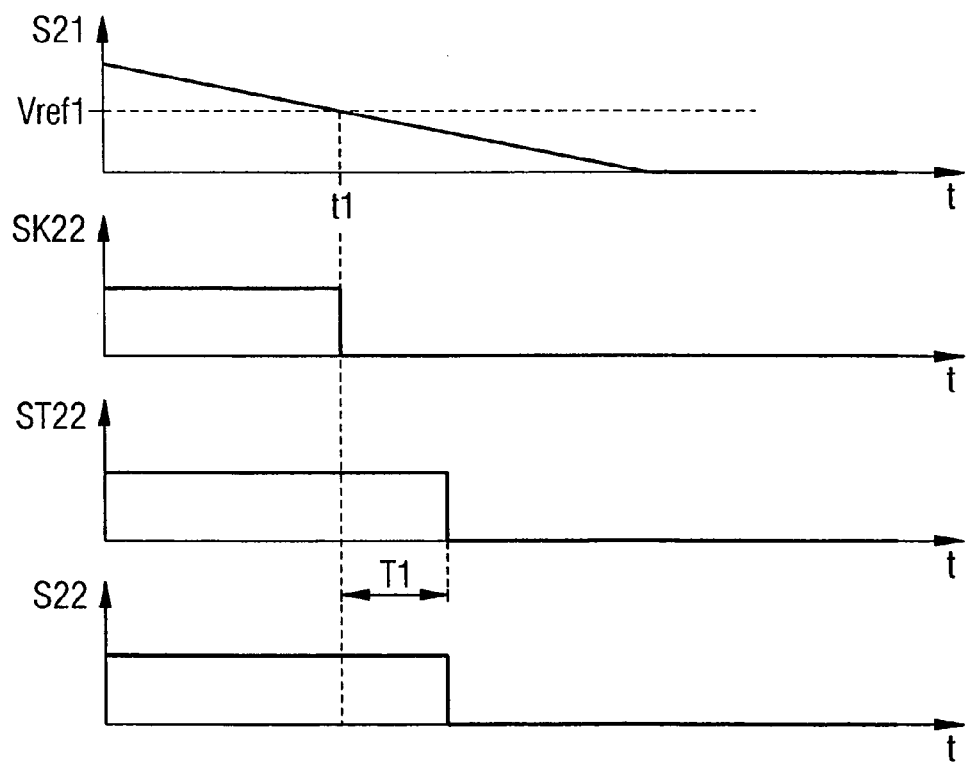

In the case of this deactivation signal generating circuit in accordance with FIG. 6a, the deactivation signal S22 does not assume a low level until a time duration T1 after the measurement signal S21/S25 has fallen below the reference value Vref, in order to switch the switch 10 off. This is based on the insight that an operation of the MOSFET T at small load currents or small drive voltages only for a short time is insufficient for destroying the MOSFET on account of the thermal instabilities that occur. The functioning of the deactivation signal generating circuit 22 in accordance with FIG. 6a is illustrated in FIG. 6b on the basis of the temporal profiles of the measurement signal S21/S25, of the output signal SK22 of the comparator K22, of the output signal ST22 of the timing element T22 and of the deactivation signal S22. At an instant t1, the measurement signal S21 falls below the reference value Vref, which results in a falling edge of the comparator output signal SK22. This falling edge is passed on to the output signal ST22 of the timing element T22 only in a manner time-delayed with a delay time T1, said output signal ST22 being fed together with the comparator output signal SK22 to the OR element OR22. The deactivation signal S22 present at the output of the OR element OR22 does not assume a low level until after the time duration T1 has elapsed after the instant t1, in order to open the switch 10. The timing element T22 is designed in such a way that a rising edge of the comparator output signal SK22 is immediately passed on to the output signal ST22, with the result that a switch-off of the switch 10 does not occur if the measurement signal falls below the value of the reference signal Vref only for a short time duration that is less than the delay time T1.

Figure 1:
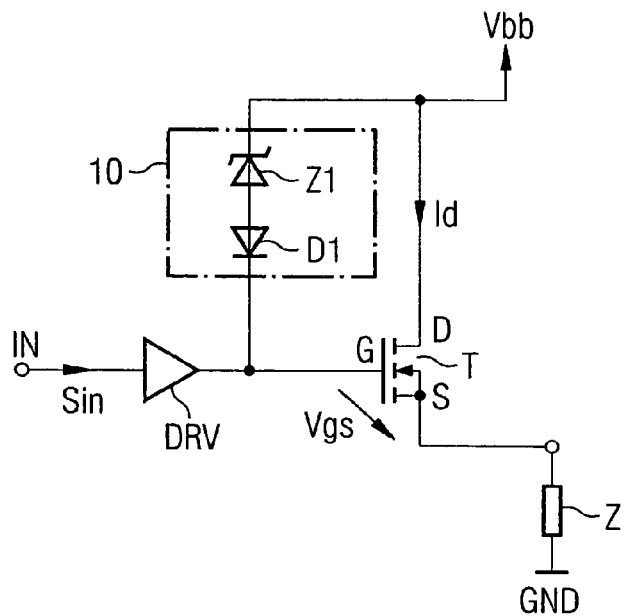
FIG. 1 shows a circuit arrangement having a load transistor and a voltage limiting circuit according to the prior art.
Figure 7A:
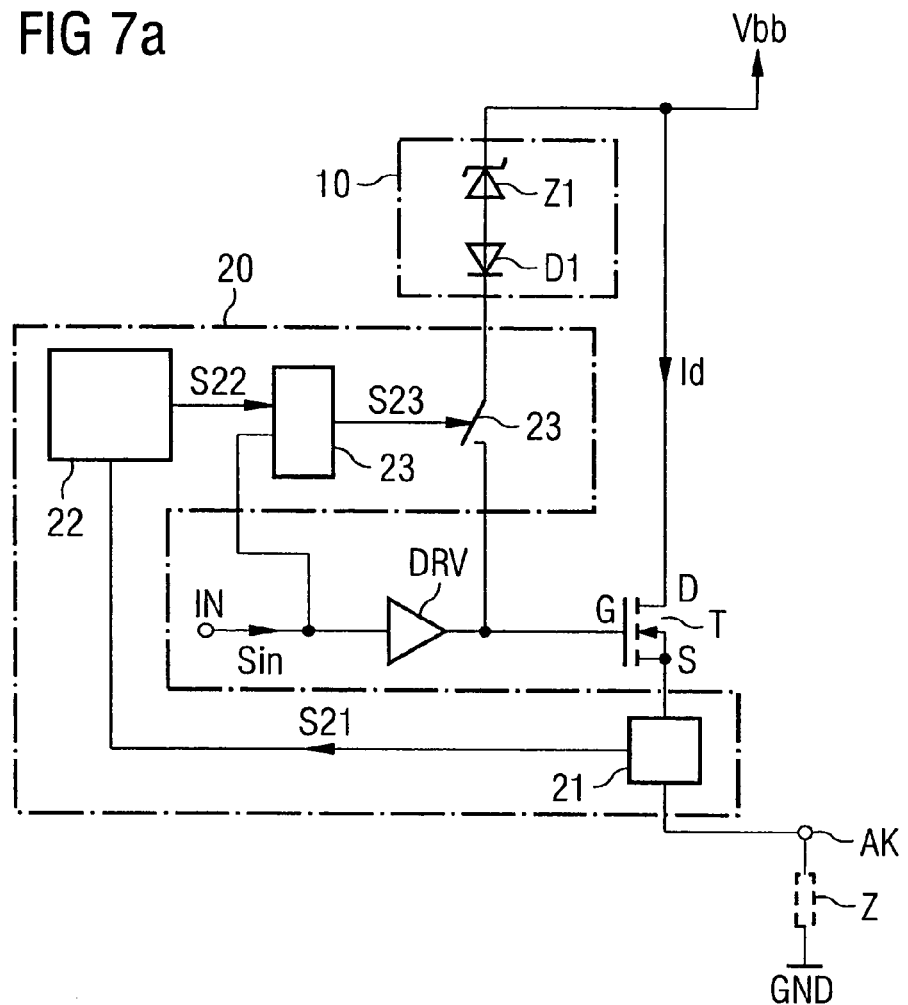
FIG. 7 shows a further exemplary embodiment of a circuit arrangement according to the invention having a load transistor, a voltage limiting circuit and a deactivation circuit (FIG. 7a) and temporal profiles of selected signals that occur in the circuit arrangement (FIG. 7b).
Figure 7B:
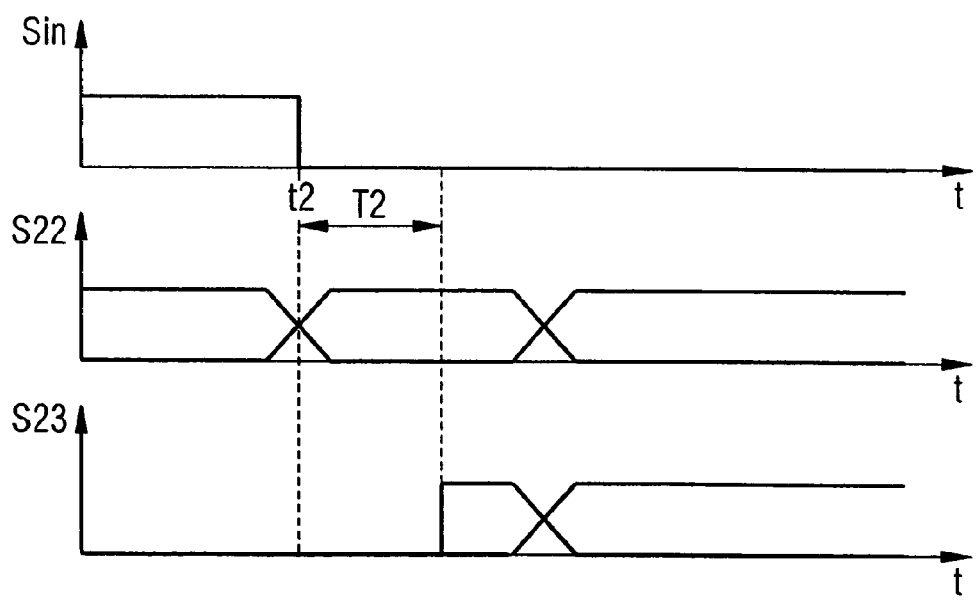

FIG. 7a shows a modification of the circuit arrangements illustrated in FIGS. 1 and 2. In the case of this circuit arrangement, the voltage limiting circuit 10 is likewise deactivated through the opening of the switch 23, the switch being driven by a drive signal S23 that is also dependent on the drive signal Sin. This ensures that the switch 23 is opened in order to deactivate the voltage limiting circuit 10 only when a switch-off signal is present at the input terminal IN, that is to say when the drive signal Sin assumes a level at which the semiconductor switch T is intended to turn off. In order to realize this dependence of the deactivation of the voltage limiting circuit 10 on the input signal Sin, the circuit arrangement in accordance with FIG. 7a provides for the deactivation signal S22 of the deactivation signal generating circuit 22 to be combined with the input signal Sin in a combination circuit 23, in order to provide a second deactivation signal S23 that drives the switch 23.

The functioning of the circuit arrangement in accordance with FIG. 7a is explained below on the basis of temporal profiles of the drive signal Sin, of the first deactivation signal S22 and of the second deactivation signal S23. For the purposes of the explanation, it shall be assumed that the drive signal Sin has a falling edge at an instant t2, that is to say changes from a high level to a low level. The deactivation signal S22 may assume over time any desired profiles dependent on the load current Id through the semiconductor switch T or on the drive voltage Vgs of the semiconductor switch. In the example, the combination circuit is designed such that the second deactivation signal S23 has a low level as long as the drive signal Sin has a high level or switch-on level, that is to say as long as the load transistor T is driven in the on state, it being sufficient, in principle, not to generate a low level of the signal S23 until shortly before the falling edge of the drive signal Sin, in order to activate the voltage limiting circuit 10 prior to the switch-off of the transistor T. What is more, the combination circuit 23 ensures that the second deactivation signal S23 still remains at a low level for a predetermined time duration T2 after a falling edge of the drive signal Sin, in order to prevent deactivation of the voltage limiting circuit 10 during this time duration after the switch-off of the load transistor T. It is only after this delay time T2 has elapsed that the profile of the second drive signal S23 follows the temporal profile of the signal S22 generated by the deactivation signal generating circuit 22. A low level of the drive signal Sin corresponds to a switch-off level or switch-off signal in the present case.

An example of the circuitry realization of a combination circuit 23 is illustrated in FIG. 8. The combination circuit comprises an AND gate AND, to which the first deactivation signal S22 is fed directly at one input. The circuit 23 furthermore comprises a delay element T23 and an inverter INV connected downstream of the delay element T23, an output signal of the inverter INV being present at a further input of the AND gate AND. The second deactivation signal S23 for driving the switch is available at the output of the AND gate AND. The delay element T23, to which the drive signal Sin is fed, is designed to pass on a falling edge of the drive signal Sin in a manner time-delayed with a delay time T2. The signal at the output of the inverter INV remains at a low level as long as the drive signal Sin has a high level, and, due to the delaying behavior of the delay element T23, also for a time duration G2 after a falling edge of the drive signal Sin. It is only after said delay time T2 has elapsed that the signal at the output of the inverter INV assumes a high level in order then to permit the signal S22 to pass.

The deactivation circuit illustrated in FIG. 7a is suitable particularly for applications in which a load transistor serves for switching an inductive load and in which, after the switch-off, for a predetermined time duration, a defined commutation of the inductive load is intended to be effected by means of the voltage limiting circuit or commutation circuit 10.

The voltage limiting or commutation circuit 10 represented heretofore in the figures represents the simplest example of the realization of such a circuit. It goes without saying that any desired further voltage limiting circuits are suitable which drive the load transistor T in the on state upon reaching a predetermined load path voltage, in order to prevent the load path voltage from rising further, or in order to clamp the load path voltage to a predetermined value, and to commutate a load.

The voltage limiting circuit 10 is advantageously realized in accordance with the exemplary embodiment illustrated in FIG. 9a. This voltage limiting circuit comprises at least two series-connected zener diodes 21, 22 and a diode D1 connected up in the manner already explained, it being possible for the limiting voltage or commutation voltage to be set in the case of this circuit 10 by virtue of the fact that one of the two zener diodes Z1 can be bridged by a switch 12. Said switch 12 is driven by a switching signal S12 derived from the drive signal Sin of the semiconductor switch T. The switching signal S12 is generated by a signal generating circuit 11 in a manner dependent on the drive signal Sin, said signal generating circuit 11 preferably being designed to the effect that after the switch-off of the load transistor T, that is to say after a falling edge of the drive signal Sin, it closes the switch 12 for a predetermined time duration T3, in order, for this time duration, to reduce the limiting or commutation voltage to the value of the breakdown voltage of the zener diode Z2. FIG. 9b shows the temporal profile of the drive signal Sin, which has a falling edge at the instant T3 in the example, after said falling edge the switch 12 being closed for the time duration T3. When using a limiting circuit in accordance with FIG. 9a in a circuit in accordance with FIG. 7a, the time duration T3 and the time duration T2 are coordinated with one another in such a way that the time duration T3 is less than the time duration T2.

Figure 10:
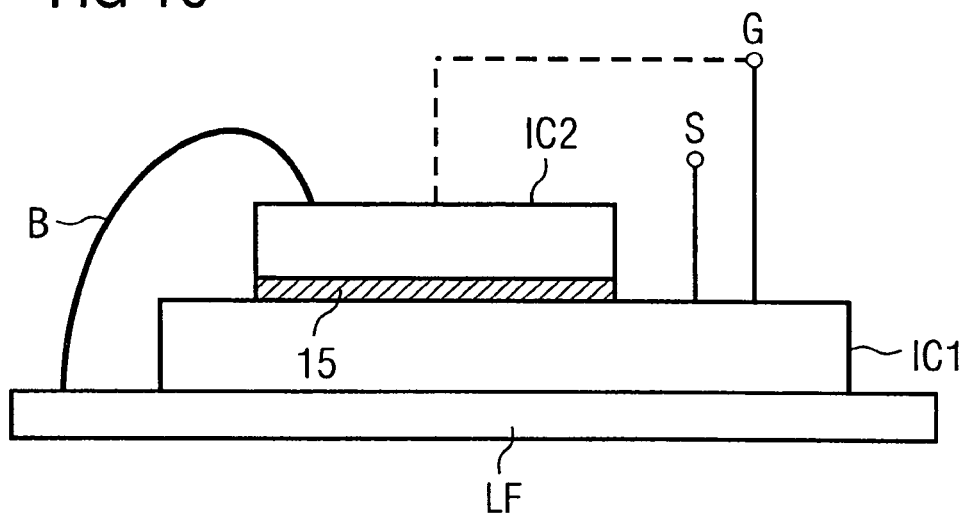
FIG. 10 schematically shows a chip-on-chip arrangement for the integration of the circuit arrangement according to the invention.

Preferably, the load transistor T is integrated in a first chip, while the voltage limiting circuit and the deactivation circuit 20 are integrated in a second chip. FIG. 10 shows a chip arrangement for the realization of such a system, IC1 designating a first chip, in which the load transistor is integrated in a manner that is not specifically illustrated, and IC2 designating a second chip, which is applied to the first chip IC1 in a manner isolated by an insulation layer 15 and in which the voltage limiting circuit 10 and the deactivation circuit 20 are integrated in the manner that is not specifically illustrated. The load transistor T is preferably designed as a vertical transistor, the drain connection of which is formed by the rear side of the semiconductor chip IC1, it being possible to make contact with the gate connection G and the source connection S at the front side of the semiconductor chip IC1, as is illustrated diagrammatically in FIG. 10. The rear side of the transistor IC1 is applied on a leadframe LF forming the drain connection. Connections of the deactivation circuit are available at the front side of the semiconductor chip IC2, a connection of the voltage limiting circuit 10 integrated in the semiconductor chip IC2 making contact with the leadframe LF via a bonding wire B, for example, in order to connect the voltage limiting circuit 10 to the drain connection of the load transistor.

The technology voltage of the semiconductor chip IC2 is preferably greater than the technology voltage of the semiconductor chip IC1, in the case of which an avalanche mode of the load transistor T commences with voltage limiting circuit 10 switched off. This ensures that the logic chip IC2 is not damaged when the load transistor T is in avalanche mode. If the two chips IC1, IC2 have the same technology voltage or if the technology voltage of the logic chip IC2 is less than that of the transistor chip IC1, then provision is made of protective structures (not specifically illustrated) of the logic chip IC2 which protect the latter from overvoltages.

The invention claimed is:

1. A circuit arrangement comprising:
 a load transistor having a control connection and a first and second load connection, the second load connection defining a circuit output configured to be coupled to an external load;
 a driver circuit coupled at an input to a source of a drive signal and at an output to the control connection of the load transistor, wherein the driver circuit is configured to output the drive signal;
 a voltage limiting circuit connected between the first load connection and the control connection of the load transistor, the voltage limiting circuit configured to limit a load path voltage of the load transistor to a predetermined clamping voltage;
 a switch connected between the voltage limiting circuit and the control connection of the load transistor, the switch being closed to connect the voltage limiting circuit to the control connection, the switch being opened to disconnect the voltage limiting circuit from the control connection, the switch being configured to open in response to receiving a deactivation signal;
 a measurement circuit coupled to the second load connection and configured to measure one of a load current through the load transistor and the drive signal, and to output a measurement signal representing a level of at least one of the load current and the drive signal; and
 a deactivation signal generating circuit having an output connected to the switch and an input coupled to receive the measurement signal, the deactivation signal generating circuit being configured to compare the received measurement signal to at least one threshold and to output the deactivation signal based on the comparison;
 wherein the load transistor undergoes transition to an avalanche mode when the voltage limiting circuit is deactivated and an overvoltage of the load transistor reaches an avalanche voltage.

2. The circuit arrangement of claim 1, wherein the voltage limiting circuit comprises at least one zener diode and a diode connected oppositely to the zener diode.

3. The circuit arrangement of claim 1, wherein the deactivation circuit is designed to deactivate the voltage limiting circuit at the earliest occurrence of a switch-off signal at the control connection.

4. The circuit arrangement of claim 1, wherein the deactivation circuit is designed to deactivate the voltage limiting circuit after the switch-off signal is present at the control connection for a predetermined time duration.

5. The circuit arrangement of claim 1, wherein the load transistor is integrated in a first semiconductor chip and the voltage limiting circuit and the deactivation circuit are integrated in a second semiconductor chip.

6. The circuit arrangement as claimed in claim 5, wherein the second semiconductor chip is disposed on the first semiconductor chip.

7. The circuit arrangement of claim 1, wherein the measurement circuit comprises a current measurement circuit configured to measure a load current in a load path of the load transistor and to output a current measurement signal representing a current level of the load current.

8. The circuit arrangement of claim 7, wherein the deactivation circuit includes a comparator circuit configured to compare the current measurement signal to a reference value that is representative of the threshold, the deactivation circuit being configured to generate a deactivation signal for deactivating the voltage limiting circuit based on the comparison.

9. The circuit arrangement of claim 8, wherein the reference value is selected such that the deactivation signal for deactivating the voltage limiting circuit is generated when the load transistor transitions from an operating state of thermal negative feedback to an operating state of thermal positive feedback.

10. The circuit arrangement of claim 9, wherein the deactivation circuit is configured to generate the deactivation signal for deactivating the voltage limiting circuit when the comparison indicates that the load current represented by the current measurement signal falls below the threshold represented by the reference value.

11. The circuit arrangement of claim 10, wherein the deactivation circuit is configured to generate the deactivation signal for deactivating the voltage limiting circuit when the comparison indicates that the load current represented by the current measurement signal falls below the threshold represented by the reference value for a predetermined duration of time.

12. The circuit arrangement of claim 1, wherein the measurement circuit comprises a voltage measurement circuit configured to measure the drive signal and to output a voltage measurement signal representing a voltage level of the drive signal.

13. The circuit arrangement of claim 12, wherein the voltage measurement circuit is connected between the control connection and the second load connection of the load transistor.

14. The circuit arrangement of claim 12, wherein the deactivation circuit includes a comparator circuit configured to compare the voltage measurement signal to a reference value that is representative of the threshold, the deactivation circuit being configured to generate a deactivation signal for deactivating the voltage limiting circuit based on the comparison.

15. The circuit arrangement of claim 14, wherein the reference value is selected such that the deactivation signal for deactivating the voltage limiting circuit is generated when the load transistor transitions from an operating state of thermal negative feedback to an operating state of thermal positive feedback.

16. The circuit arrangement of claim 15, wherein the deactivation circuit is configured to generate the deactivation signal for deactivating the voltage limiting circuit when the comparison indicates that the level of the drive signal represented by the voltage measurement signal falls below the threshold represented by the reference value.

17. The circuit arrangement of claim 16, wherein the deactivation circuit is configured to generate the deactivation signal for deactivating the voltage limiting circuit when the comparison indicates that the level of the drive signal represented by the voltage measurement signal falls below the threshold represented by the reference value for a predetermined duration of time.

* * * * *